United States Patent [19]

Sonntag

[11] 3,925,807

[45] Dec. 9, 1975

[54] HIGH VOLTAGE THYRISTOR

[75] Inventor: Alois Sonntag, Muhlheim, Germany

[73] Assignee: Licentia Patent-Verwaltungs-G.m.b.H., Frankfurt am Main, Germany

[22] Filed: Nov. 26, 1974

[21] Appl. No.: 527,396

[30] Foreign Application Priority Data

Nov. 27, 1973 Germany .......................... 2358937

[52] U.S. Cl. ...................... 357/55; 357/38; 357/52

[51] Int. Cl.$^2$ .......................................... H01L 29/06

[58] Field of Search .................... 357/38, 39, 55, 52

[56] References Cited

FOREIGN PATENTS OR APPLICATIONS

| | | | |
|---|---|---|---|
| 1,360,744 | 4/1964 | France | 357/55 |
| 437,539 | 3/1966 | Switzerland | 357/55 |
| 1,028,767 | 5/1966 | United Kingdom | 357/55 |
| 1,057,214 | 2/1967 | United Kingdom | 357/55 |

*Primary Examiner*—Andrew J. James
*Assistant Examiner*—Joseph E. Clawson, Jr.
*Attorney, Agent, or Firm*—Spencer & Kaye

[57] ABSTRACT

To increase the reverse voltage blocking capability and the forward current-carrying capacity of a thyristor of the type composed of a fully diffused, generally cylindrical semiconductor element having two opposed major surfaces between which are provided a sequence of semiconductor zones defining pn-junctions, and having a conically tapered edge surface extending between the major surfaces, the circumference of one of the semiconductor zones is formed to present two conical surface portions which slope radially inwardly toward one another and which intersect essentially at a plane parallel to the pn-junctions, one of the surface portions intersecting one of the junctions bordering the semiconductor zone and having a greater slope than the other of the edge surface portions, and the latter being located to not intersect any pn-junction. In addition, the two pn-junctions bordering the one semiconductive zone have respectively different radii and the difference between their radii is greater than the thickness of the one semiconductor zone.

3 Claims, 1 Drawing Figure

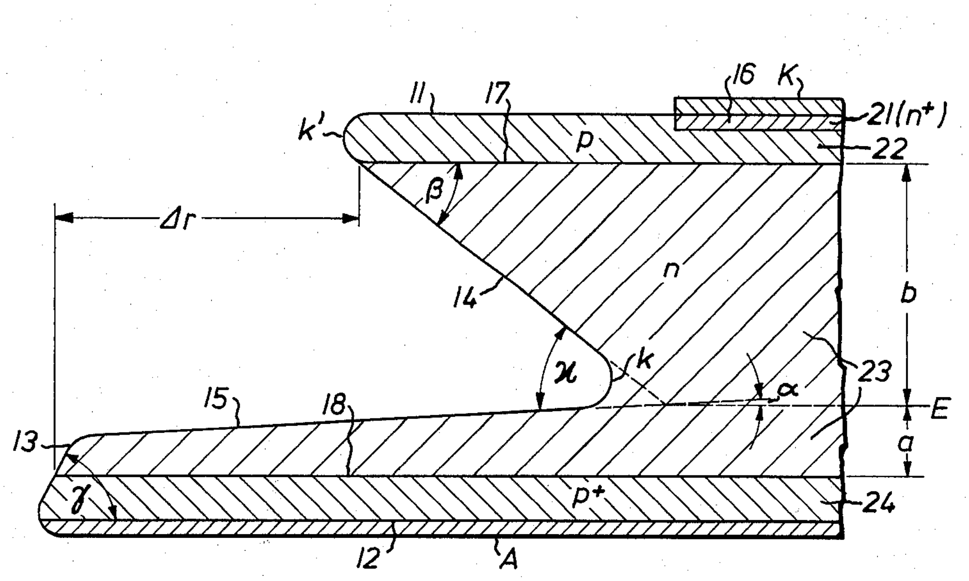
16
K
11
17
k'
p
21(n+)
22
β
Δr
n
b
14
k
23
ϰ
α
15
18
E
13
a
γ
p+
24
12
A

HIGH VOLTAGE THYRISTOR

BACKGROUND OF THE INVENTION

The present invention relates to a thyristor capable of operation at high voltages in the kilovolt range, the thyristor being of the type including a fully diffused wafer-shaped semiconductor element which is provided with electrodes at its two major surfaces, which major surfaces have respectively different sizes, and the edge surfaces of the element being conically tapered.

The conical tapering of the edge surfaces of wafer-shaped semiconductor elements is known and is shown, for example, in FIGS. 1–3 of German Auslegeschrift (Published application) No. 1,250,008, and in German Auslegeschrift No. 1,212,215. This tapering is generally employed for thyristors with high blocking capability in order to extend the space charge region of the center pn-junction which blocks in the forward direction of the thyristor at the oblique edge surface and in order to reduce the field intensity at the edge surface. However, to provide a blocking capability of about 2kV, it is necessary that the edge surface be tapered, particularly at this center pn-junction, at a small angle of about 2°. This requires that the semiconductor wafer have an appropriately wide edge outside of the smaller current-conducting main surface which is contacted, i.e. there must be provided a semiconductor wafer with a large diameter which has the desired monocrystalline quality and can thus carry the corresponding high current loads.

German Auslegeschrift No. 1,250,008 also discloses, particularly in connection with FIGS. 5 to 7 thereof, a wafer-shaped semiconductor element having symmetrically ground edges at an edge surface of the element which is not tapered. The use of such an element for a highly blocking transistor does not restrict the surface utilization as discussed above, but a reduction in the edge surface field intensity in such an element, which would be comparable with that of a wafer element with a tapered edge surface, can be realized only by providing an anode base zone which is almost twice as thick. Independently of the profile of the edge surface, the thickness of the anode base zone in thyristors is determined substantially by the required blocking capability. A greater thickness of a semiconductor layer, particularly a silicon layer, results in a greater forward voltage, however, and higher transmission losses.

Another problem encountered in elements having symmetrically ground edges is that the sharp ground edges at the thin zones which lie completely or only partly at the major surfaces can easily break off.

It is known that a thyristor with high blocking capability requires a low preliminary doping of the semiconductor wafer employed. A thyristor with high current capability on the other hand, requires, as mentioned above, correspondingly large current carrying major surfaces and thus the semiconductor wafer must have a large diameter. Since, however, the lower this homogeneous doping is intended to be, the more difficult is the manufacture of semiconductor wafers with large diameters and homogeneous doping, the blocking capability and current carrying capability requirements of a thyristor are basically contradictory, and reduction in the difficulties in the manufacture of large diameter monocrystals with weak homogeneous doping depends mainly on developments in the crystal growing art.

The above-outlined problems are increased by the demands which users place on the recovery time of highly blocking and high power thyristors. This imposes a further limitation on the development of a highly blocking thyristor with an upwardly limited recovery time by setting an upper limit on the lifetime of the charge carriers in the base zone of the semiconductor element. In contradistinction thereto, the lower limit which can be placed on the charge carrier lifetime, in order to obtain a low forward voltage, is determined by the level of the required blocking capability; a corresponding lower limit value for the lifetime increases, however, with the thickness of the base zone. This limitation becomes less critical as a greater amount of current-carrying major surface is obtained by an improvement in the edge profile in order to reduce the edge surface field intensity.

SUMMARY OF THE INVENTION

It is an object of the present invention to give a high voltage thyristor a blocking capability of much more than 2.5kV; the ability to continuously conduct a current of several hundred amperes, and a recovery time which is no greater than that of known thyristors, this being accomplished by optimum shaping and dimensioning of the semiconductor device and of the zone structure of the device.

These and other objects of the invention are achieved by certain improvements in the configuration of a thyristor for operation at high voltages and including: a fully diffused, generally cylindrical semiconductor element having two opposed end surfaces defining major surfaces of the element, the major surfaces being of respectively different radii, and the element further having a conically tapered edged surface extending between the major surfaces, the element being composed of a plurality of semiconductive regions of alternatingly opposite conductivity types defining pn-junctions lying in planes essentially parallel to the major surfaces, one of the semi-conductive regions being bounded by first and second ones of the pn-junctions, the first one of the pn-junctions being arranged to be reverse-biassed in the forward conducting direction of the thyristor, and the first and second ones of the pn-junctions having respectively different radii; and two electrodes each contacting a respective major surface.

According to the present invention, the circumference of at least part of the one semiconductive region is radially constricted and is defined by two surfaces portions lying in conical planes sloping radially inwardly toward one another intersecting at an intersection plane parallel to the pn-junctions; one of the surface portions intersects the first one of the junctions and extends substantially to the smaller one of the major surfaces; the other of the surface portions extends to the tapered edge surface and is located entirely between the first and second ones of the junctions so as to not intersect any pn-junction; the angle between the one of the surface portions and the first one of the junctions is larger than the angle between the other of the surface portions and the intersection plane; the distance between the first one of the junctions and the intersection plane is greater than the distance between the second one of the junctions and the intersection plane; and the distance between the first one of the junctions and the second one of the junctions is smaller than the difference between the radii of the first and second ones of the junctions.

Within the scope of these dimensioning conditions, the present invention is defined by embodiments of semiconductor devices in whcih the tapered edge surface forms an angle with the larger major surface in the range of from 10° to 40°.

In order to particularly protect the peripheral edges of the major surfaces of a semiconductor device according to the invention against breaking off under excess mechanical stresses, in accordance with a further embodiment of the present invention these edges and the edge which is ground into the edge surface are rounded.

Due to the electrical properties which can thus be attained, the advantages of the invention can in particular be realized when these thyristors are used for current rectifiers for high voltage direct current transmission. For such rectifiers the thyristors previously employed had a blocking capability up to about 2.5 kV and had to be arranged in a series connection of many thyristors, which were, for example, connected in parallel in pairs.

If it is possible, however, to use thyristors having a much higher blocking capability than 2.5 kV, the number of series-connected thyristors required for handling the same voltage is correspondingly reduced, as are the complexity and cost of the associated control and switching devices. With a smaller number of series-connected thyristors the forward voltage and thus the transmission losses of the individual current rectifier branches are also reduced. The use of such highly blocking thyristors thus can result in a considerable reduction in investment costs for electronic systems and for the cooling devices required for such systems.

Since the thyristors according to the present invention also have a high current carrying capability, there results the additional advantage that the number of thyristors which must be connected in parallel to handle the operating current intensity in question is less, or at least no greater, than before.

The present invention can also be applied with advantage to the so-called frequency thyristors in which the cathode is subdivided into many sections by a radially branched, finger-shaped control electrode.

BRIEF DESCRIPTION OF THE DRAWING

The single FIGURE of the drawing is a cross-sectional view, along one diameter, of the edge region of a fully diffused, wafer-shaped semiconductor device according to the invention.

DESCRIPTION OF THE PREFERRED EMBODIMENTS

The semiconductor device shown in the FIGURE is provided with a cathode electrode K and an anode electrode A at respective ones of its major surfaces 11 and 12 which are of different sizes. The anode A extends over the entirety of the larger major surface 12. The cathode K extends almost over the entirety of the smaller major surface 11. A control electrode (not shown) is also disposed on surface 11.

The device is constituted essentially by a wafer containing four successive layers 21, 22, 23 and 24 of alternatingly opposite conductivity types, with pn-junctions 16, 17 and 18 being formed between adjacent layers. Thus, junction 16 is formed between $n^+$ layer 21 and p layer 22, junction 17 is formed between p layer 22 and n layer 23, and junction 18 is formed between n layer 23 and $p^+$ layer 24.

The wafer, which is originally of cylindrical shape, is conically tapered along its edge surface 13 so that surface 13 forms an angle $\gamma$ with the larger major surface 12 of the semi-conductor wafer.

It should here be noted that the various dimensions of the semiconductor device are not shown to the same scale in the drawing; the vertical dimensions of the device are shown to approximately twice the scale of the horizontal dimensions.

As can be seen, a circumferential edge $k$ is ground into the slanted edge surface 13 in a region which is closer to anode A than to cathode K. This edge $k$ is defined by two ground surfaces 14 and 15 which constitute conical surfaces enclosing an angle $\kappa$. The location of edge $k$ is defined approximately by the circle of intersection of surfaces 14 and 15, which lies in a plane E parallel to the pn-junction surfaces 16, 17 and 18 and the major surfaces 11 and 12.

The ground surface 14, which extends essentially to the smaller major surface 11, intersects the pn-junction surface 17, which blocks in the forward direction of the thyristor, at an angle $\beta$ which is greater than the angle $\alpha$ formed between plane E and the other ground surface 15. Also the distance b between plane E and the pn-junction surface 17 is greater than the distance a between plane E and the pn-junction surface 18.

The cross-sectional area of the current conducting path through the thyristor is determined substantially by the size of the smaller major surface 11 of the wafer-shaped semiconductor device which in the direction of the larger major surface 12 must be surrounded by an edge zone and the higher the required blocking capability for a desired current carrying capability, the greater must be the breadth of the edge zone and the base width a+b of the zone 23. In the FIGURE the breadth of the edge zone is evident in the difference $\Delta r$ which is defined hereafter. However, a substantial reduction of the base width for a desired blocking capability, as can subsequently be seen, is resulting from the sloping contour of the conical surfaces 14 and 15 defining edge $k$. The difference $\Delta$r between the radii of two circular pn-junction surfaces 17 and 18 is thus greater than the distance a+b between the two pn-junction surfaces 17 and 18.

A wafer-shaped semiconductor device with ground edges in its slanted edge surface and having the dimensions described above may have a blocking capability of 5 kV and a capability of carrying for example 400 amperes on a continuous basis. This capability is made possible mainly in that with an applied high voltage the edge surface field intensity at the line of intersection of the surface 14 and the pn-junction surface 17 is substantially reduced as a result of the edge surface contour formed by surface 14.

While this applies to the forward blocking capability of a thyristor, the reverse blocking capability is made possible in that with an applied high voltage the edge surface field intensity at the line of intersection of the surface 15 and the pn-junction 18 is comparably reduced as a result of the edge surface contour formed by the surfaces 14, 15.

The edges K' and k as well as the edges in the conically tapered surface 13 are rounded for the purpose of reducing the possibility of breakage. In the current conducting path of the thyristor the diameter of the circumferential edge k must not be smaller than the diameter of the cathode K.

While with ground edges according to FIGS. 5 to 7 of German Auslegeschrift No. 1,250,008 the base width of the lightly doped n-zone of the thyristor must be almost twice the value of the theoretically required base width for a desired blocking capability in order to keep the edge surface field intensity low, the is not required in a thyristor according to the present invention.

In order to explain the effects of the edge grinding according to the invention, the case will first be considered where the pn-junction 17 is polarized in the blocking direction. In this case the positively defined slant of the ground surface 14 has the effect that the space charge in the n-base zone 23 initially expands along the ground surface 14 with a rate of field intensity decrease greater than the average rate in this n-base zone 23. Consequently, the edge surface field intensity is also less than the bulk field intensity. This applies as long as the limit of the space charge has not reached the edge of the plane E, i.e. the ground edge k. The limit of the space charge must not have reached the ground edge *k* before the bulk field intensity in the n-base zone has increased as high as the break-over value. The term "limit" appears somehow figurative and stands for a non-stationary boundary.

If this plane E lies in the lower portion of the n-base zone 23, a major portion of the voltage already is dropped along the ground surface 14 before the space charge limit bends around edge k and expands in the region of the negative slant of the ground surface 15. If angle $\beta$ and the distance of plane E from pn-junction 17 are selected correctly, the space charge gradient or distribution can be forced to take on such a shape that the field intensity will not reach a breakthrough value at any point of the edge surface.

If now the pn-junction 18 is polarized in the blocking direction, the taper of the ground surface 15 must be considered to be positive. Since the distance of the plane in which the ground surface 15 intersects the conical taper 13 from pn-junction 18 is only slight, the space charge limit can quickly overcome the long and relatively flat ground surface 15 and thus reach the edge of plane E even with a low blocking voltage. With an increase in voltage, the space charge will then expand further along the now negatively defined taper of ground surface 14 and will curve in the direction toward pn-junction 18. Seen from the anode side of the thyristor, the edge profile of the semiconductor element, in which there is not much n-type silicon in front of the p-type anode zone, now acts as a positive conical edge taper. Since the limit of the space charge zone in the $p^+$ anode zone abuts the conically tapered edge surface 13, it will further expand in the n-type base zone on the negatively tapered ground surface 14 above plane E in the direction toward the pn-junction 17 so that a corresponding countercharge with respect to the $p^+$ anode zone is included. This expansion takes place the more rapidly the larger is the difference $\Delta$ *r* between the radii of the pn-junction surfaces 17 and 18.

Suitable selection of the values of this difference can be used to produce a thyristor in which a reverse voltage of the edge surface field intensity applied to the thyristor also will not lead to breakthrough anywhere on the device.

In the prefered embodiment of the invention an operative and typical semiconductor device (thyristor) according to the figure has major surfaces 11 and 12 with diameters of 40 mm and 46 mm respectively and a difference $\Delta r$ and 3 mm between the radii of the pn-junction surfaces 17 and 18. The values of the angles $\gamma$, $\beta$, $\alpha$ and $\kappa$ as defined above are about 40°, 45°, 5° and 50° respectively. The distance *b* between plane E and the pn-junction surface 17 is 650 $\mu$m and the distance a between plane E and the pn-junction 18 is 150 $\mu$m. Consequently, the n-base zone 23 is 800 $\mu$m in thickness. A thyristor having the sloping contour of the conical surfaces 14 and 15 and the dimensions specified above may have a blocking capability up to 6 kV and a capability of carrying 400 amperes on a continuous basis, if the case temperature is prevented from exeeding 85° Celsius. The thyristor wafer is provided with an aluminium sheet for the anode A, and is also provided with a layer of gold which is coated with a thin etch-proof cover of chromium for the cathode. The gold layer and the cover may be between 2$\mu$m and 3$\mu$m thick.

It will be understood that the above description of the present invention is susceptible to various modifications, changes and adaptations, and the same are intended to be comprehended within the meaning and range of equivalents of the appended claims.

I claim:

1. In a thyristor for operation at high voltages and including: a fully diffused, generally cylindrical semiconductor element having two opposed end surfaces defining major surfaces of the element, the major surfaces being of respectively different radii, and the element further having a conically tapered edge surface extending between the major surfaces, the element being composed of a plurality of semiconductor regions of alternatingly opposite conductivity types defining pn-junctions lying in planes essentially parallel to the major surfaces, one of the semiconductive regions being bounded by first and second ones of the pn-junctions, the first one of the pn-junctions being arranged to be reverse-biassed in the forward conducting direction of the thyristor, and the first and second ones of the pn-junctions having respectively different radii; and two electrodes each contacting a respective major surface; the improvement wherein: the circumference of at least part of said one semiconductive region is radially constricted and is defined by two surface portions lying in conical planes sloping radially inwardly toward one another and intersecting at an intersection plane parallel to said pn-junctions; one of said surface portions intersects said first one of said junctions and extends substantially to the smaller one of said major surfaces; the other of said surface portions extends to said tapered edge surface and is located entirely between said first and second ones of said junctions so as to not intersect any pn-junction; the angle between said one of said surface portions and said first one of said junctions is larger than the angle between said other of said surface portions and said intersection plane; the distance between said first one of said junctions and said intersection plane is greater than the distance between said second one of said junctions and said intersection plane; and the distance between said first one of said junctions and said second one of said junctions is smaller than the difference between the radii of said first and second ones of said junctions.

2. Thyristor as defined in claim 1 wherein said tapered edge surface forms an angle of between 10° and 40° with the larger of said major surfaces.

3. Thyristor as defined in claim 1 wherein the edge formed in the region of intersection between said surface portions and the peripheral edges of said major surfaces are rounded.

* * * * *